(12) United States Patent
Hargis et al.

(10) Patent No.: US 7,160,039 B2
(45) Date of Patent: Jan. 9, 2007

(54) COMPACT OPTICAL SUB-ASSEMBLY WITH INTEGRATED FLEXIBLE CIRCUIT

(75) Inventors: Marian C. Hargis, Rochester, MN (US); David Peter Gaio, Rochester, MN (US); Roger T. Lindquist, Dodge Center, MN (US); William K. Hogan, Merritt Island, FL (US); James Walling, West Melbourne, FL (US); Sundeep Nangalia, Raleigh, NC (US); Philip Deane, Indian Harbour Beach, FL (US); Miles F. Swain, Hayfield, MN (US); Christopher M. Gabel, Rochester, MN (US)

(73) Assignee: JDS Uniphase Corporation, Milpitas, CA (US)

( * ) Notice: Subject to any disclaimer, the term of this patent is extended or adjusted under 35 U.S.C. 154(b) by 0 days.

(21) Appl. No.: 11/042,868

(22) Filed: Jan. 25, 2005

(65) Prior Publication Data
US 2005/0175299 A1   Aug. 11, 2005

Related U.S. Application Data

(60) Provisional application No. 60/539,219, filed on Jan. 26, 2004.

(51) Int. Cl.
*G02B 6/36* (2006.01)
*H05K 1/14* (2006.01)
*H05K 5/00* (2006.01)

(52) U.S. Cl. .................. 385/93; 385/88; 385/92; 361/736; 361/752; 361/756

(58) Field of Classification Search ............ 385/88–94
See application file for complete search history.

(56) References Cited

U.S. PATENT DOCUMENTS

| 5,005,939 A | 4/1991 | Arvanitakis et al. |
| 5,537,504 A | 7/1996 | Cina et al. |
| 6,358,066 B1 * | 3/2002 | Gilliland et al. ........... 439/76.1 |
| 6,931,181 B1 * | 8/2005 | Jewell et al. .................. 385/49 |
| 2003/0118293 A1 * | 6/2003 | Canace et al. ................ 385/92 |
| 2004/0067030 A1 * | 4/2004 | Rathnam et al. .............. 385/92 |
| 2005/0018978 A1 * | 1/2005 | Nevo et al. ................... 385/92 |

* cited by examiner

*Primary Examiner*—John D. Lee
*Assistant Examiner*—Rhonda S. Peace
(74) *Attorney, Agent, or Firm*—Allen, Dyer, Doppelt, Milbrath & Gilchrist, P.A.

(57) ABSTRACT

The invention relates to an optical sub-assembly package for use in receiver optical sub-assemblies or transmitter optical sub-assemblies in which the electrical connections between the transducer chip, e.g. photo-detector or light source, and the device printed circuit board is made by a single flexible circuit conductor extending through the wall of the package. The package is comprised of a housing and a stiffening plate, which encloses and end of the housing and forms a mechanical support for an end of the flexible circuit conductor.

17 Claims, 11 Drawing Sheets

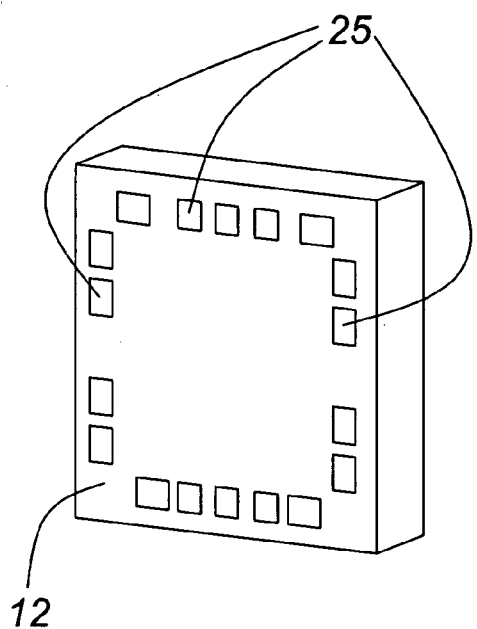
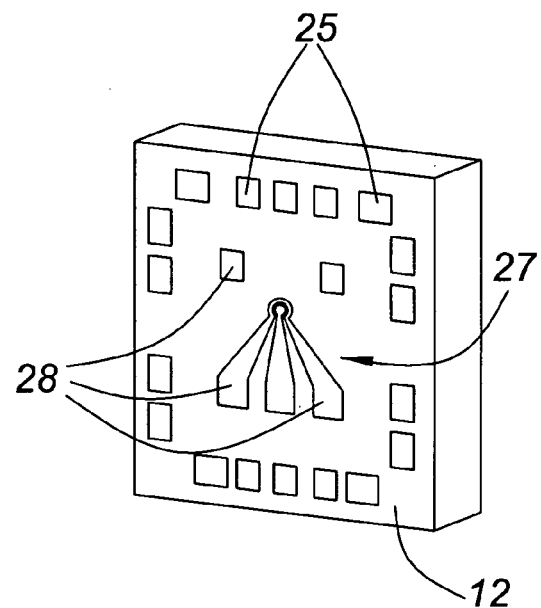
FIG. 5A     FIG. 5B
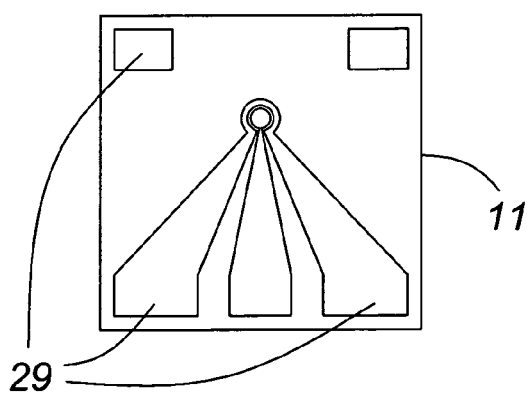
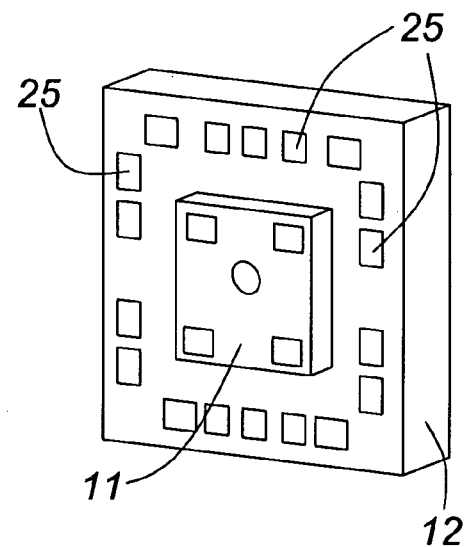
FIG. 5C     FIG. 5D

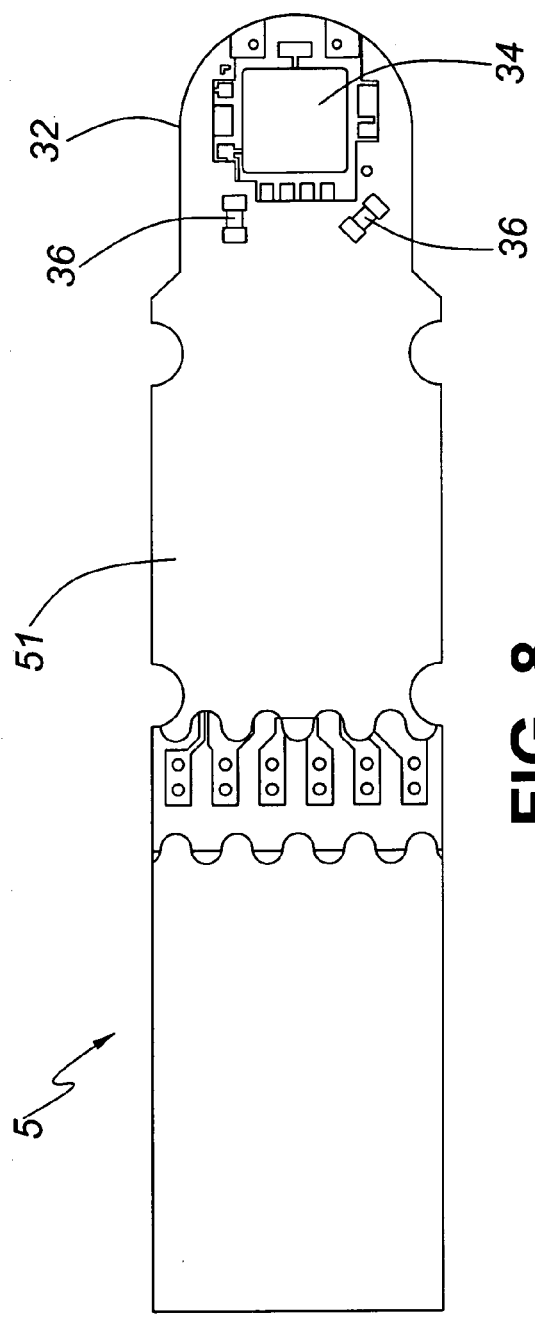
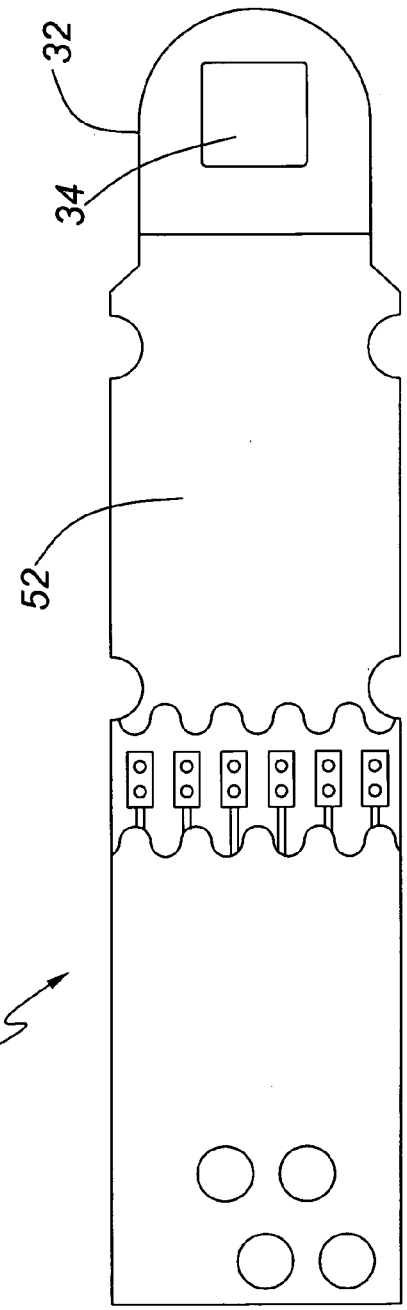
FIG. 8
FIG. 9

COMPACT OPTICAL SUB-ASSEMBLY WITH INTEGRATED FLEXIBLE CIRCUIT

CROSS-REFERENCE TO RELATED APPLICATIONS

The present invention claims priority from U.S. Patent Application No. 60/539,219 filed Jan. 26, 2004, which is incorporated herein by reference.

TECHNICAL FIELD

The present invention relates to a compact optical sub-assembly (OSA), and in particular to an OSA including an integrated flexible circuit connector extending from an opto-electronic transducer chip within the OSA housing to printed circuit board (PCB) electronics of a transceiver.

BACKGROUND OF THE INVENTION

The driving forces in the transceiver manufacturing industry are reducing the form factor sizes, increasing the data transfer rates, and decreasing the costs. To achieve all of these goals, the conventional transistor outline (TO) can design approach must be replaced with a more exotic component packaging approach. However, to provide an OSA that can be used over a wide range of data transfer rates and products, the OSA must use controlled impedance connections for the high speed RF electrical signal path between the OSA chip and the transceiver electronics. Moreover, the total number of component parts must be reduced, and manufacturable from readily available materials. The assembly processes, including optical alignment, must be simplified and/or automated to reduce labor costs and increase production rates, and the fiber receptacle components should support a variety of wavelengths.

Conventional OSA designs, such as the one disclosed in U.S. Pat. No. 5,537,504, issued Jul. 16, 1996 to Cina et al and assigned to the present Applicant, include a opto-electronic (O/E) transducer 4 mounted in a container 25, which is sealed by a window 26. Solid metallic leads 23 and 24 extend through the rear of the container 25 for soldering to other electrical leads or directly to a transceiver PCB. The window 26 limits the relative positioning of the fiber, the lens and the O/E transducer, and the leads 23 and 24 limit the quality of the transmission and the positioning of the transceiver PCB. The use of flexible-tape conductive wiring has been disclosed in U.S. Pat. No. 5,005,939 issued Apr. 9, 1991 to Arvanitakis et al and assigned to the present Applicant, but only for connecting the existing leads of an OSA to the transceiver PCB. Moreover, the Arvanitakis et al device does not disclose the use of multi-layer micro strip transmission lines required for high-quality high-data rate signals.

An object of the present invention is to overcome the shortcomings of the prior art by providing an optical sub-assembly with an integrated flexible circuit conductor for reducing the number and length of electrical interfaces between the OSA chip and the transceiver electronics to reduce the strength of electrical signal reflections.

SUMMARY OF THE INVENTION

Accordingly, the present invention relates to an optical sub-assembly comprising:

an optical connector for receiving an end of an optical fiber, which transmits a beam of light including an optical signal;

a housing coupled to the optical connector;

a stiffening plate mounted on an end of the housing forming an enclosure therewith;

a transducer mounted on the stiffening plate for converting the optical signal into an electrical signal or for converting an electrical signal into the optical signal;

a lens mounted in the housing for relaying the beam of light between the optical fiber and the transducer along an optical axis; and a flexible circuit conductor for transmitting the electrical signal to or from the transducer, one end of which is supported by the stiffening plate and electrically connected to the transducer within the enclosure, the other end of which extends outside of the housing for electrical connection with control electronics of a host device.

BRIEF DESCRIPTION OF THE DRAWINGS

The invention will be described in greater detail with reference to the accompanying drawings which represent preferred embodiments thereof, wherein:

FIG. 5a to 5d are isometric views of a flip-chip bonded photo-detector for the optical sub-assembly of FIGS. 1 to 4;

FIG. 8 is a top view of the flexible circuit conductor of the optical sub-assembly of FIGS. 1 to 4;

FIG. 9 is a bottom view of the flexible circuit conductor of the optical sub-assembly of FIGS. 1 to 4;

DETAILED DESCRIPTION

Figure 1:
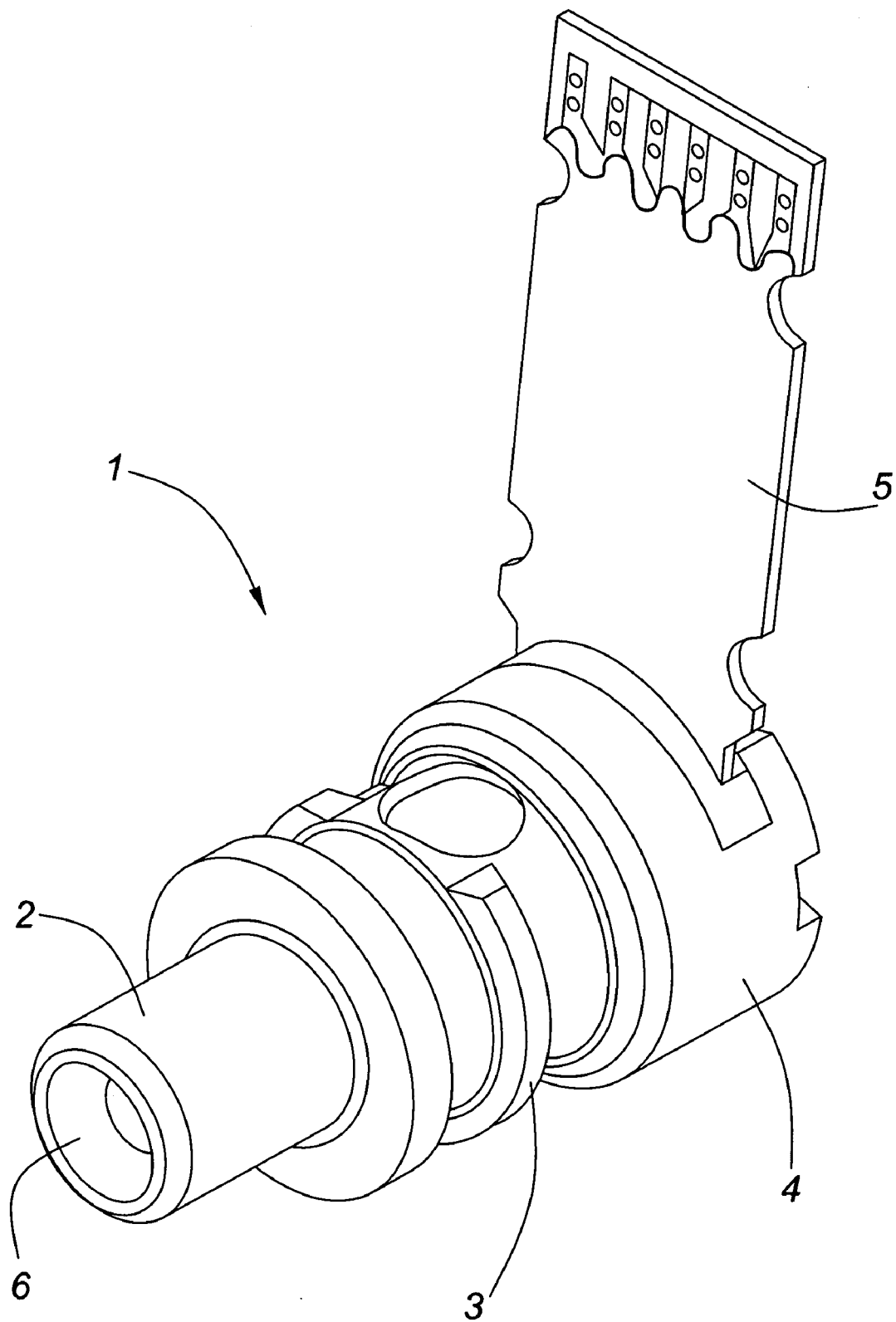
FIG. 1 is an isometric view of an optical sub-assembly according to the present invention.
Figure 2:
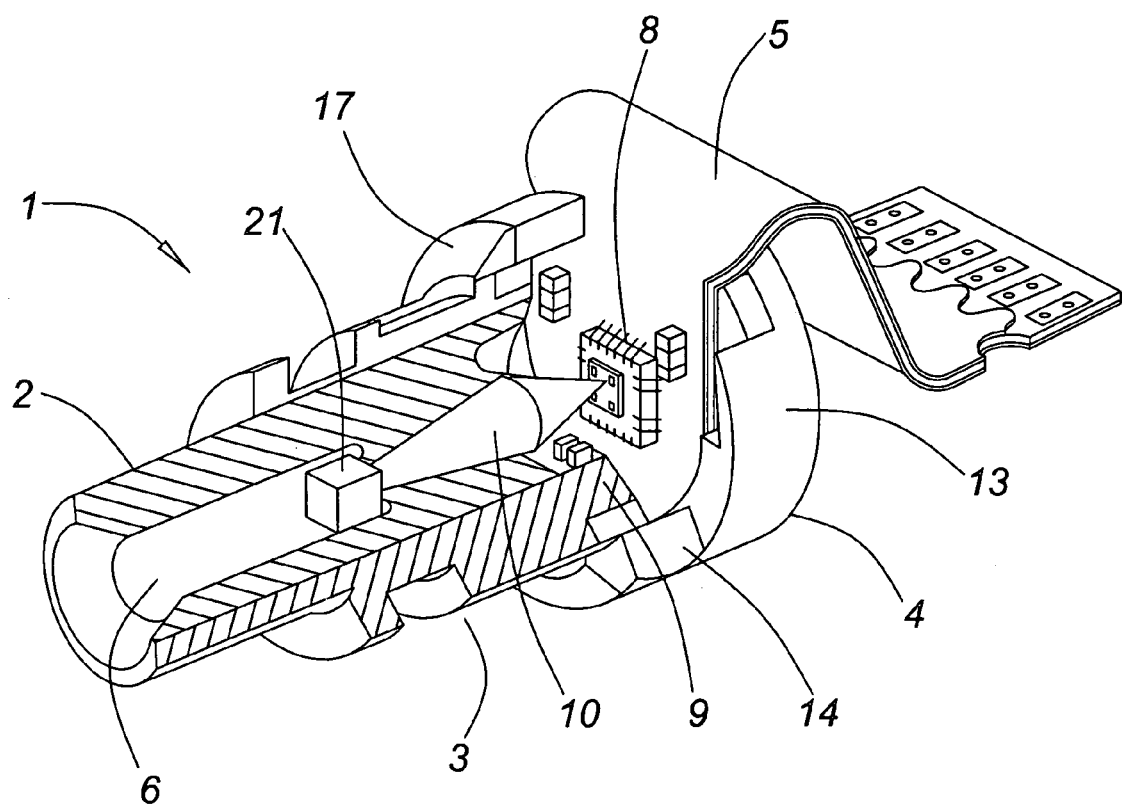
FIG. 2 is a partially sectioned isometric view of the optical sub-assembly of FIG. 1.
Figure 3:
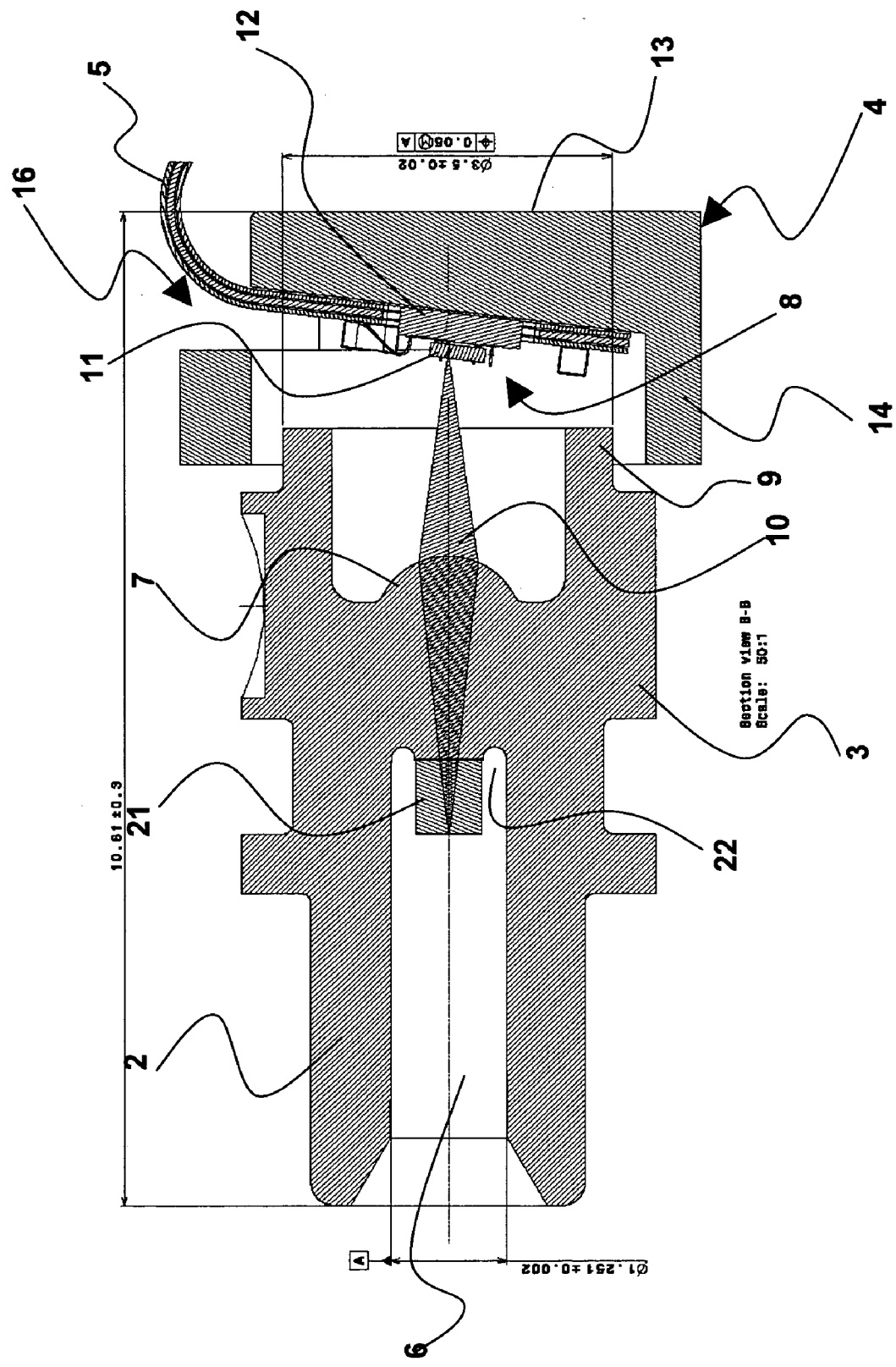
FIG. 3 is a cross-sectional view of the optical sub-assembly of FIGS. 1 and 2.

With reference to FIGS. 1 to 4, an OSA, generally indicated at 1, according to the present invention includes an optical connector 2, at the front end thereof, a housing 3, and a stiffening plate ring 4, at the rear end thereof with a flexible circuit 5 extending outwardly therefrom. The optical connector 2 includes a bore 6 for receiving a ferrule on an end of an optical fiber, as is well known in the art, which transmits an beam of light 10 containing an optical signal to or from the optical sub-assembly 1. The housing 3 includes a mounting flange 9, and a lens 7, which relays the beam of light 10 between the optical fiber an opto-electronic (O/E) transducer, generally indicated at 8. The OSA 1 could be either a receiver optical sub-assembly (ROSA) or a transmitter optical sub-assembly (TOSA). For a ROSA, the O/E transducer 8 includes a photo-detector 11 with a trans-impedance amplifier (TIA) 12 connected thereto. For a TOSA, the O/E transducer 8 includes a light source, e.g. a vertical cavity surface emitting laser (VCSEL), with a laser driver connected thereto. Preferably the optical connector 2, the housing 3, the lens 7 and the mounting flange 9 are all integrally formed from an optical grade plastic, e.g. ULTEM1010.

The stiffening plate ring 4 includes a base 13, on which the O/E transducer 8 is mounted, an annular flange 14, and a slot 16. The annular flange 14 mates with or surrounds the mounting flange 9, which are secured together using an adhesive 17 or other suitable means. FIG. 5 illustrates an embodiment of an OSA 1' according to the present invention, in which the annular flange 14' includes teeth 18 for mating with teeth 19 extending from the mounting flange 9'. The interlocking teeth 18 and 19 provide a much more robust housing structure.

The stiffening plate ring 4, which provides a solid support for an end of the flexible circuit 5, can be constructed out of a material, e.g. zinc, aluminum, with high thermal conductivity (TC), i.e. between 100 and 500 W/m°K or several times more than that of the conventional TO can housing, which enables the OSA 1 to run at higher operating temperatures before thermally induced noise becomes a factor. For example: $TC_{Al}=237$ W/m°K, $TC_{Zn}=116$ W/m°K, $TC_{Cu}=410$ W/m°K To reduce back reflections in a ROSA, the O/E transducer 8 is mounted at a non-normal angle to the incoming optical beam of light 5, so that any reflected light will not be reflected directly back through the lens 7 into the optical fiber. The base 13 is at a nominal angle of between −4° and −10°, preferably −7°, from a plane normal to the incoming optical beam 10, i.e. the inner surface of the base 13 is at an acute angle of between 80° and 86° from a central optical axis of the beam of light 10.

To further limit back reflections as the beam of light 10 exits the optical fiber, an index-matching optical insert 21 is mounted on a front surface of the lens 7. The optical insert 21 has an index of refraction closely matching that of the optical fiber. Preferably, the optical insert 21 is a rectangular or cylindrical block of silica, BK7, or Borosilicate float glass. Ideally the optical insert 21 is fixed to the front surface of the lens 7 using an index-matching adhesive, preferably having an index of refraction midway between the index of refraction of the optical insert 21 and the index of refraction of the lens 7. Alternatively, the optical insert 21 can be mounted to the front surface of the lens 7 by some other means, such as press fitting.

Ideally the optical insert 21 projects outwardly into the bore 6 of the optical connector 2 forming a trough 22 therearound. The trough 22 will provide an area for collecting any dust or foreign particles entering the bore 6 to prevent this material from being embedded into the optical insert 21.

Figure 4:
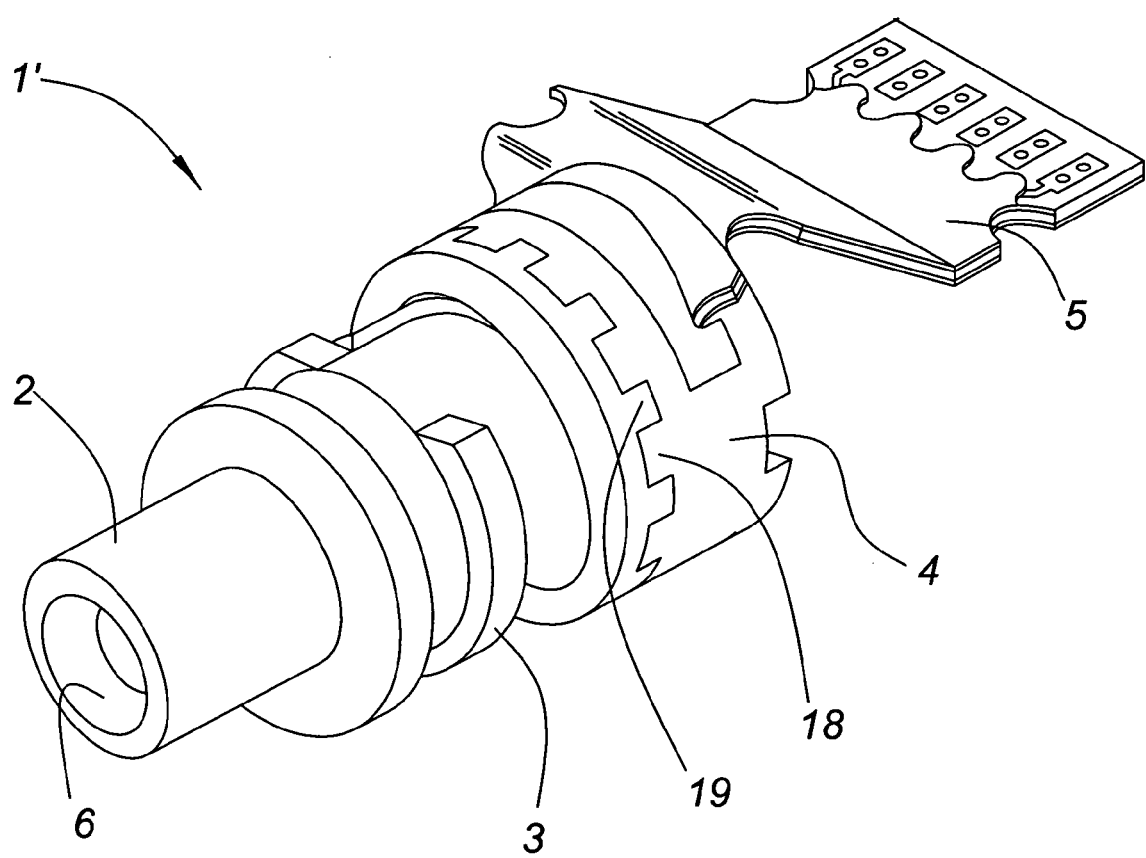
FIG. 4 is an alternative embodiment of an optical sub-assembly according to the present invention.

Since the optical fiber is silica based, the reflection at the optical fiber/optical insert 21 interface is negligible. The difference in refractive index at the optical insert 21/plastic lens 7 interface does result in a small amount of back reflection. However, as is illustrated in FIG. 4, the beam of light 10 expands prior to hitting the front surface of the lens 7, and continues to expand as it is reflected back to the optical fiber. Accordingly, the overlap between the back reflected light and the optical fiber mode is relatively small, i.e. only a small fraction of the beam of light 10 is reflected back to the optical fiber. To reduce the back reflection even further, the size of the optical insert 21 can be increased beyond the usual 0.8 mm length.

With reference to FIGS. 5a to 5d, the photo-detector 11 is preferably a rear-illuminated reverse-biased photodiode, which responds to an incident optical signal by generating a current with both an AC and a DC component. Electrical contacts 28 on a mounting surface of the TIA 12 are connected to corresponding electrodes 29 on the photo-detector 11 using any one of many known methods, such as the use of solder bumps in a flip chip bonding process. Preferably a redistribution layer 27, with the pre-amplifier contacts 28, is preferably added to the TIA 12 after initial processing to match the electrical contacts 29 on the photo-detector 11. The flip chip bonding process provides very low package parasitics, while enabling the photo-detector 11 to be aligned with high precision. Alternatively, a wiring layout with contacts 28 can be added to the metallurgy of the TIA 12 during initial processing; however, this method precludes the TIA 12 from being used with standard wire bonds, as well.

Figure 6:
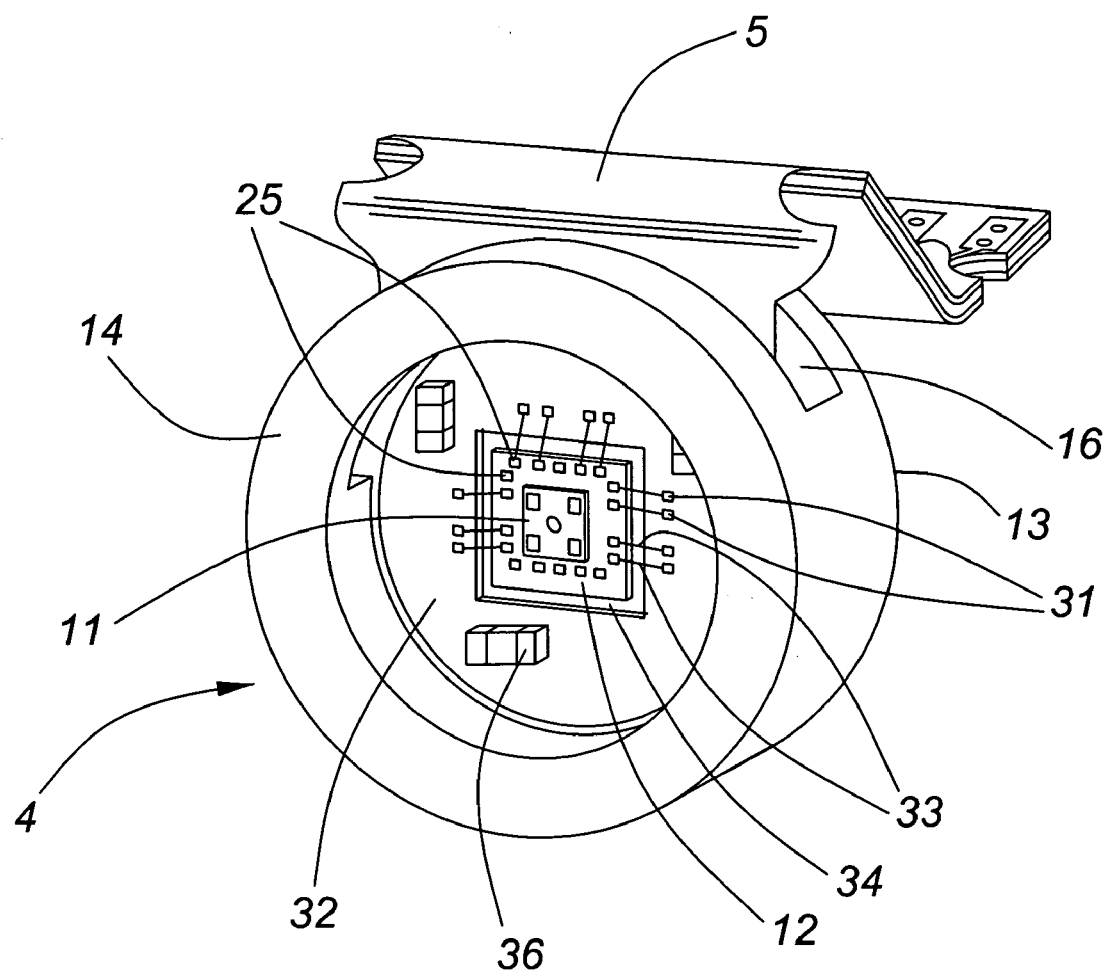
FIG. 6 is an isometric view of the back end of the optical sub-assembly of FIGS. 1 to 3.

With reference to FIG. 6, outer contacts 25 on the TIA 12 are electrically connected to corresponding contacts 31 on a rounded end 32 of the flexible circuit conductor 5 using short leads 33. A portion of the end 32 is cut away leaving an opening 34, through which the TIA 12 and the photo-detector 11 can extend, as the end 32 is fixed to the base 13 of the stiffening plate ring 4. Other electrical components 36 can be positioned on the end 32 proximate the transducer 8, e.g. capacitors used in low pass filters for the TIA 12 or inductive choke components, which enable DC current to be fed to a laser without a reduction in the AC RF signal.

Figure 7:
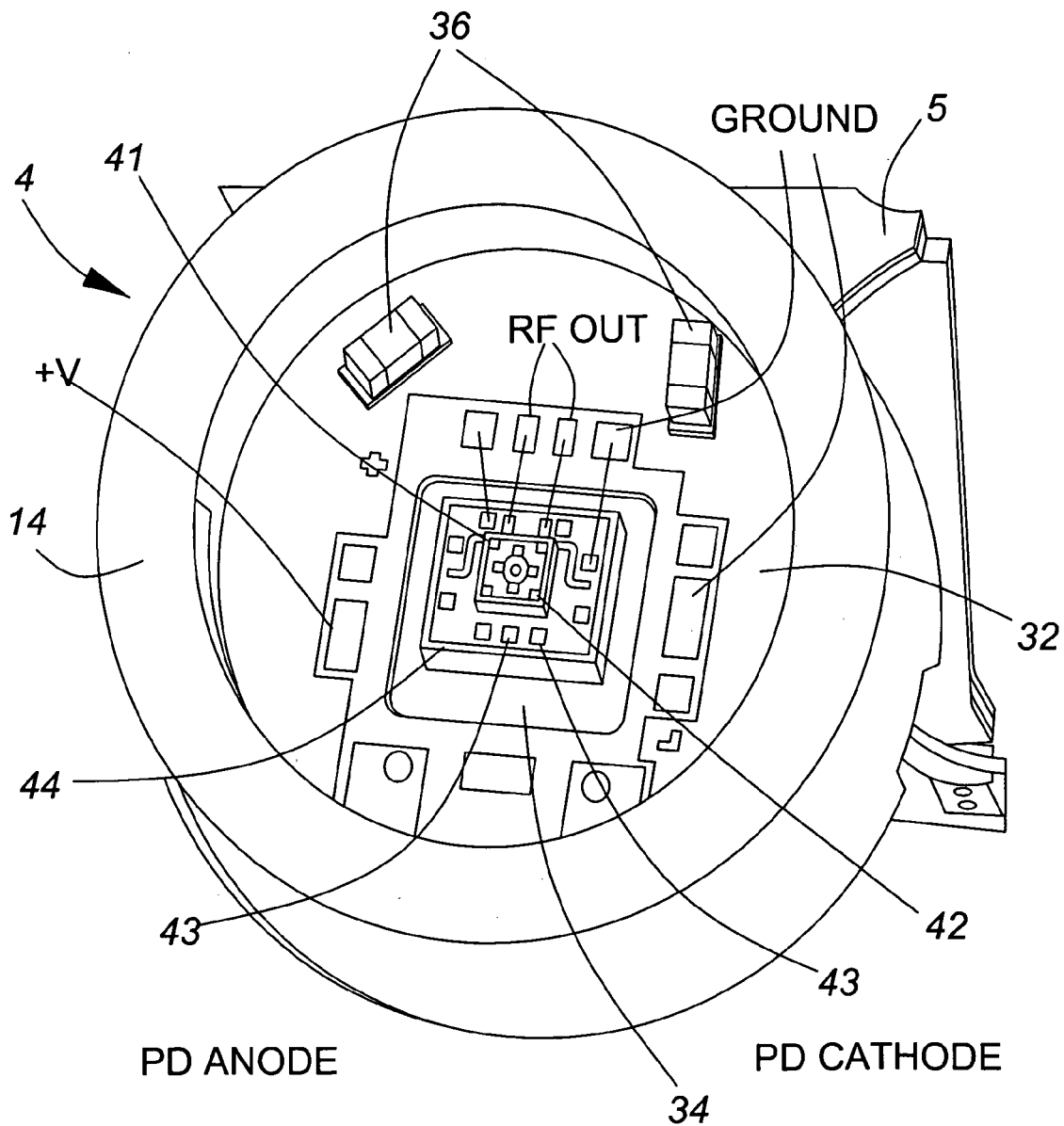
FIG. 7 is an isometric view of the back end of the optical sub-assembly of FIGS. 1 to 3 with an alternative photo-detector.

A front-illuminated photo-detector 41 (FIG. 7) could also be used, in which top-side contact pads 42 on the photodiode substrate connect to pads 43 on the TIA 44. Newly developed front-illuminated photodiodes bring the substrate contact to the top surface of the photodiode, so that both contacts (Anode and Cathode) can be made with wire bonds. The TIA 44 and the flexible circuit conductor 5 each include six corresponding electrical trace leads, two for power transmission (+V, Gnd), two for differential data transmission (RF Out), and two for optical power monitoring. Alternatively, the photo-detector 11 and the TIA 12 could be attached beside each other on the stiffener plate 4.

Since the OSA housing 3/stiffening plate 4 is not hermetically sealed, the transducer 8 must be coated in order to survive under environmental stress conditions. Special chip level coatings, e.g. $SiO_2$, can be applied during the fabrication of the transducer 8 or the transducer 8 can be coated or encapsulated during the assembly of the OSA 1. With reference to the aforementioned flip chip assembly process, an encapsulation is used by under filling the cavity between the active surface of the photo-detector 11 and the top surface of the transimpedance amplifier 12. If the active side is up, as in the front illuminated photo-detector 41 illustrated in FIG. 7, an encapsulation is applied over the active photo-detector chip 41.

Since the transducer 8 is not hermetically sealed in its own container, the hermetic window found in the prior art devices is unnecessary. Accordingly, lens 7 can be positioned relatively close to the transducer 8, which enables a small spot to be created on the photo-detector 11, while maintaining a low numerical aperture. At higher data rates it is important to be able to provide a small spot, since the active region of the photo-detector is reduced to lower the capacitance-increasing bandwidth. In lower data rate photo-detectors, e.g. 2.5 Gb/s, the active regions have a diameter of 70 to 100 um, whereas in higher data rate photo-detectors, e.g. 10 Gb/s, 20 to 40 um diameter active regions are used. Since the diameter of multi-mode fiber is between 50 and 62.5 um, it is highly advantageous to be able to position the lens 7 proximate the photo-detector 11 in order to produce magnification less than unity, while still providing a relatively low numerical aperture.

With reference to FIGS. 8 and 9, the flexible circuit conductor 5 is a multi-layer micro-strip transmission line including a first conductive layer 51 (FIG. 8) for the information signals, and a second conductive ground layer 52 (FIG. 9), which enables the layout of controlled impedance transmission lines required for high-quality high data rate signals.

Figure 10:
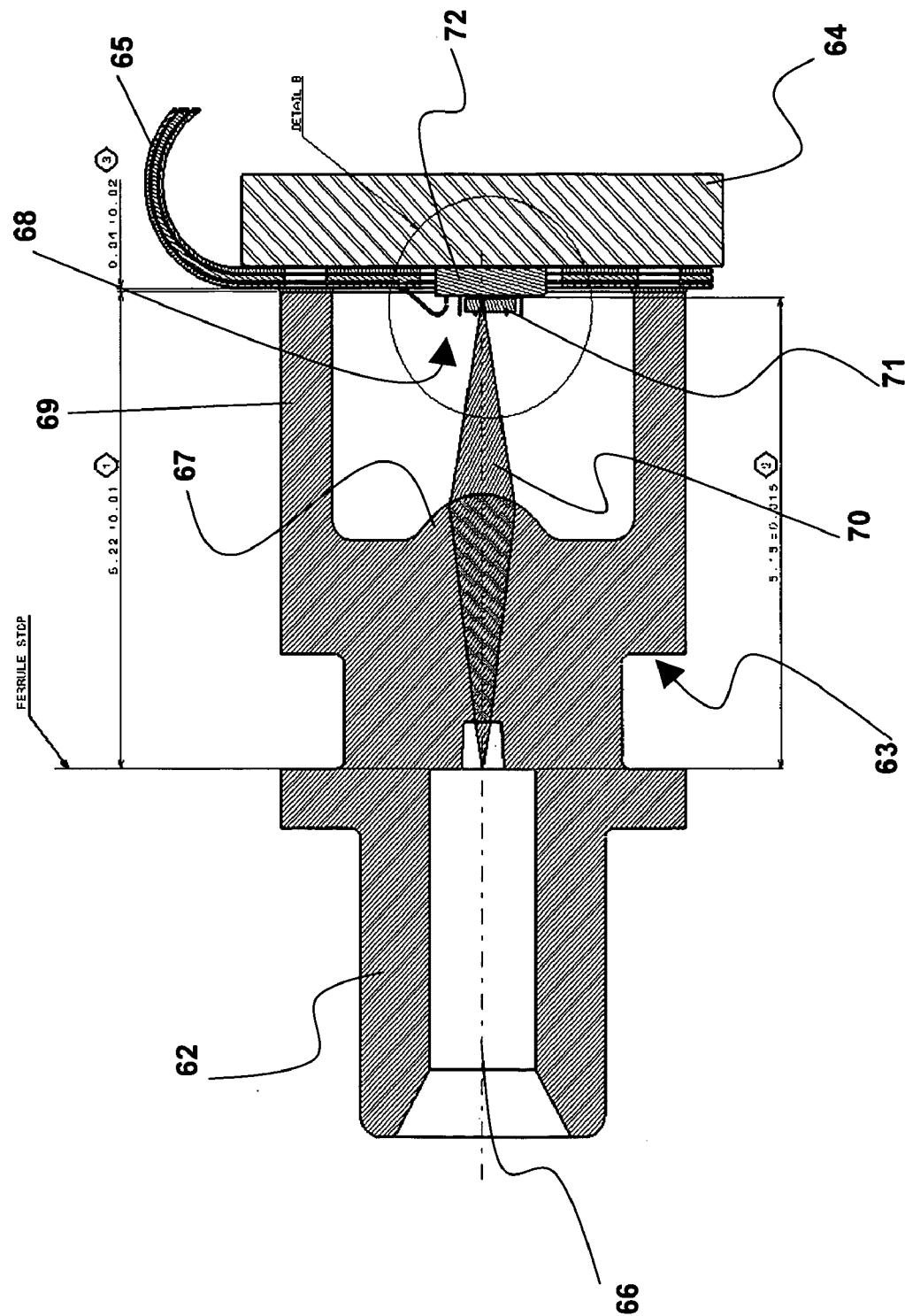
FIG. 10 is an alternative embodiment of the optical sub-assembly according to the present invention.

Another embodiment of the present invention in the form of OSA 61 is illustrated in FIG. 10, and includes an optical coupler 62, a housing 63, a stiffening plate 64, and a flexible circuit conductor 65 extending out from the side thereof. As above, the optical coupler 62 and the housing 63 are integrally formed defining a bore 66 for an optical ferrule (not shown), and a lens 67. The flexible circuit conductor 65 is electrically connected to a transducer 68, e.g. photo-detector or VCSEL, and sandwiched between a mounting flange 69 of the housing 62 and the stiffening plate 64. The flexible circuit 65 can include connecting portions on opposite surfaces thereof to facilitate attachment of the mounting flange 69 and the stiffening plate 64. The stiffening plate 64, like the stiffening plate ring 4, is preferably cylindrical, although any other suitable shape is possible. As above, in the case of a ROSA, the lens 67 focuses a beam of light 70 onto a photo-detector 71 to convert the optical signal therein into an electrical signal, which is transmitted through TIA 72 to the transceiver PCB via flexible circuit conductor 65. The end of the flexible circuit conductor 65 is supported by the stiffening plate 64 and surrounds the transducer 68 to provide easy access to a variety of contacts thereon.

The stiffening plate 64 can be constructed out of a material with high thermal conductivity, i.e. >100 W/m°K or more than ten times that of the conventional TO can housing, e.g. zinc, aluminum, which enables the OSA 61 to run at higher operating temperatures before thermally induced noise becomes a factor.

Figure 11:
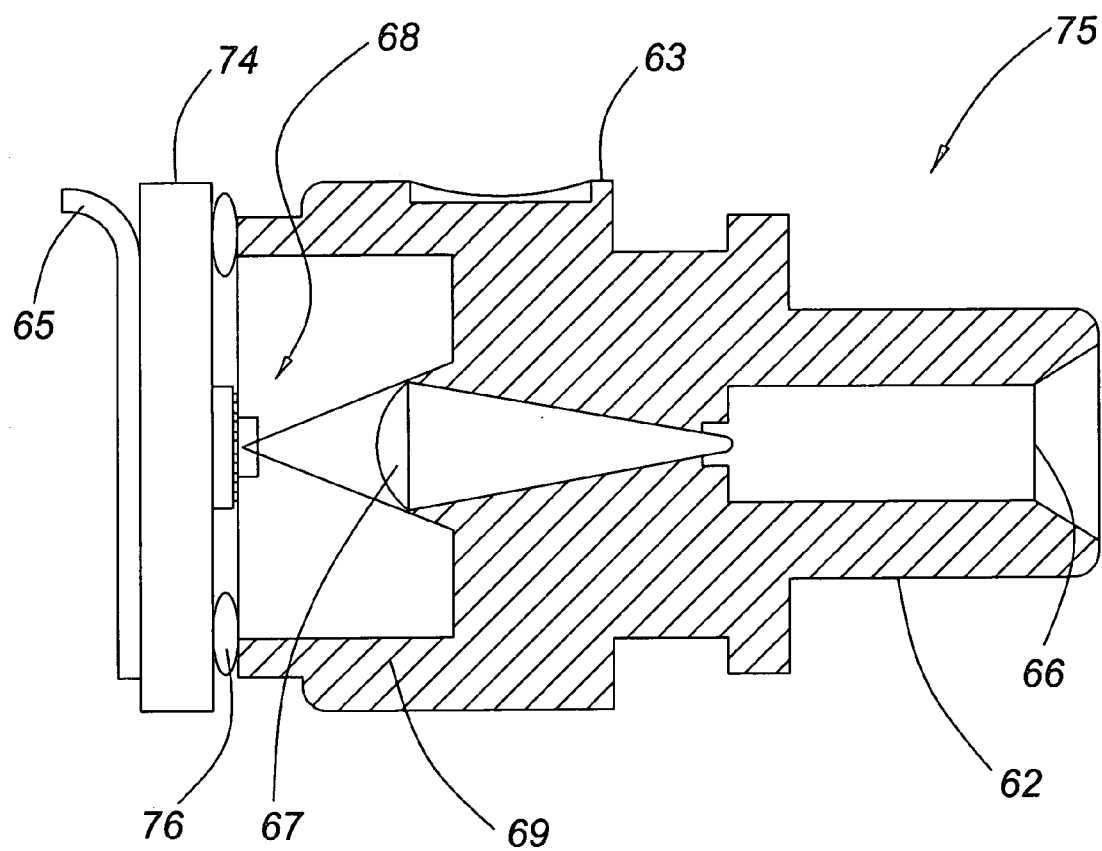
FIG. 11 is an alternative embodiment of the optical sub-assembly according to the present invention.

Another embodiment of the present invention is illustrated in FIG. 11, in which an OSA 75 includes the a similar integrated optical coupler 62/housing 63, as above, but with the stiffening plate 64 replaced by a square stiffening plate 74 fabricated from a printed circuit board material, e.g. FR4. The stiffening plate 74 is attached to the mounting flange 69 with an adhesive 76 for enclosing the housing 63. Accordingly, the stiffening plate 74 provides support for the end of the flexible circuit conductor 65, while providing electrical communication between the transducer 68 and the flexible circuit conductor 65.

Figure 12:
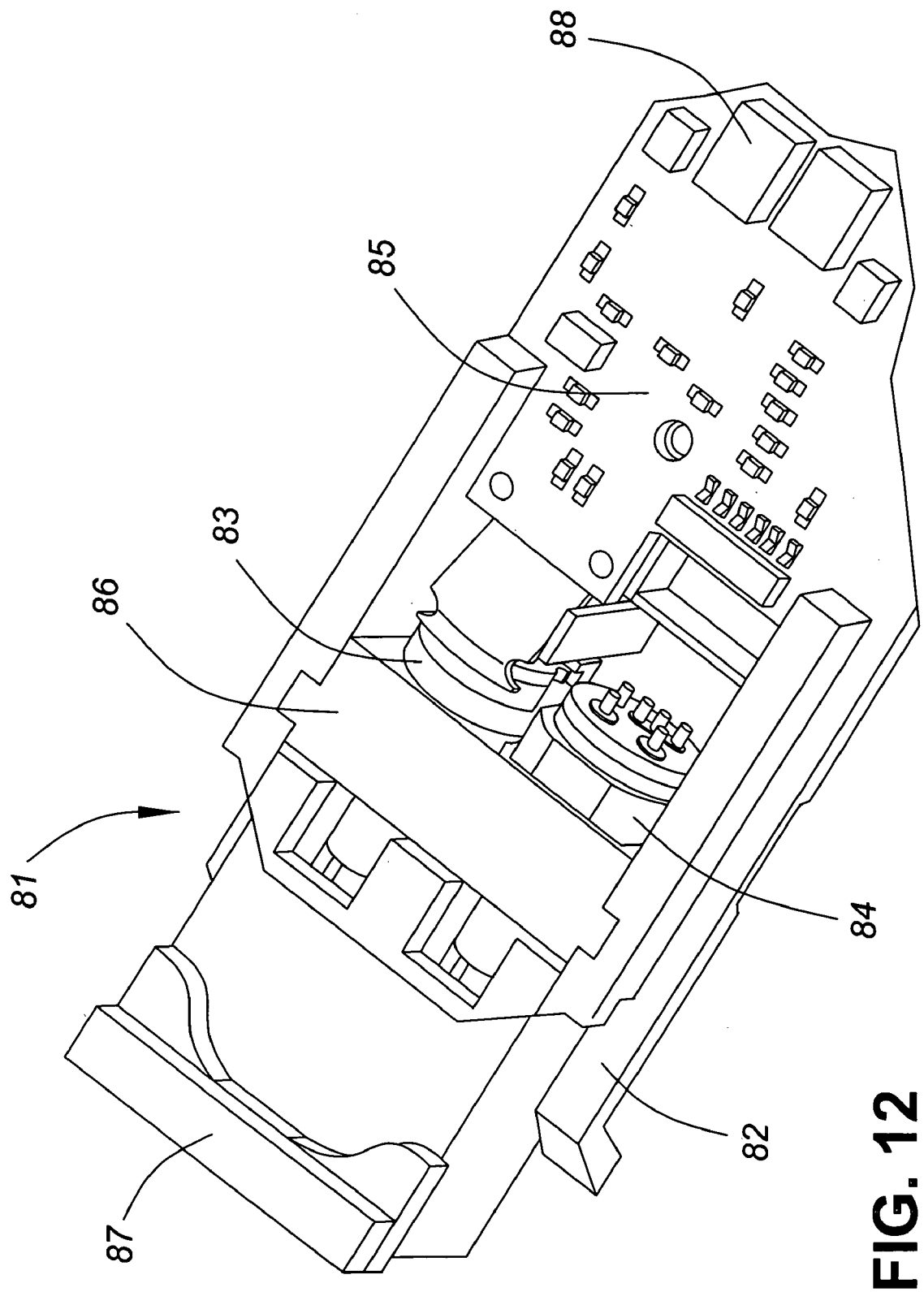
FIG. 12 is an optical transceiver device with the optical sub-assembly of FIGS. 1 to 3 mounted therein.

An optical transceiver device 81, illustrated in FIG. 12, includes a module casing 82 supporting a ROSA 83 (similar to OSA 1), a TOSA 84 and a PCB 85. An OSA saddle adapter 86 provides extra support for the OSA's 83 and 84 in the casing 82. Front end 87 of the casing 82 includes an optical connector adapted to receive a duplex optical connector, e.g. LC or SC, mounted on the end of a pair of optical fibers for transmitting optical signals to and from the OSAs 83 and 84. An electrical connector, e.g. pins or card edge connector, (not shown) extends from the PCB 85 at the back end 88 of the casing 82 for connecting the transceiver to a PCB in a host device.

We claim:

1. An optical sub-assembly comprising:
   an optical connector for receiving an end of an optical fiber, which transmits a beam of light including an optical signal;
   a housing coupled to the optical connector;
   a stiffening plate mounted on an end of the housing forming an enclosure therewith;
   a transducer mounted on the stiffening plate for converting the optical signal into an electrical signal or for converting an electrical signal into the optical signal;
   a lens mounted in the housing for relaying the beam of light between the optical fiber and the transducer along an optical axis; and
   a flexible circuit conductor for transmitting the electrical signal to or from the transducer along controlled impedance transmission lines, one end of which is supported by the stiffening plate and electrically connected to the transducer within the enclosure, the other end of which extends outside of the housing for electrical connection with control electronics of a host device;
   wherein the transducer is positioned in close enough proximity to the lens to provide a magnification of the optical fiber of less than one to reduce a spot size of the beam of light to between 20 to 40 μm diameter.

2. The optical sub-assembly according to claim 1, wherein the optical connector, the lens and the housing are integrally formed.

3. The optical sub-assembly according to claim 2, wherein the stiffening plate is comprised of a material that has a thermal conductivity greater than 100 W/m °K.

4. The optical subassembly according to claim 1, wherein the transducer comprises a rear illuminated photo-detector flip chip bonded onto a transimpedance amplifier, which is mounted on the stiffener plate and electrically connected to the flexible circuit conductor.

5. The optical sub-assembly according to claim 1, wherein the transducer comprises a front illuminated photo-detector mounted on a transimpedance amplifier.

6. The optical sub-assembly according to claim 1, wherein a portion of the end of the flexible circuit conductor is sandwiched between the stiffening plate and the housing.

7. The optical sub-assembly according to claim 1, wherein the enclosure is non-hermetic; and wherein the transducer is encapsulated with a hermetic coating for protection against environmental stress.

8. The optical sub-assembly according to claim 1, further comprising a index matching block within or adjacent the optical coupler having an index of refraction similar to that of the optical fiber, for limiting the amount of light reflected back into the optical fiber.

9. An optical sub-assembly comprising:
   an optical connector for receiving an end of an optical fiber, which transmits a beam of light including an optical signal;
   a housing coupled to the optical connector;
   a stiffening plate mounted on an end of the housing forming an enclosure therewith;
   a transducer mounted on the stiffening plate for converting the optical signal into an electrical signal or for converting an electrical signal into the optical signal;
   a lens mounted in the housing for relaying the beam of light between the optical fiber and the transducer along an optical axis; and
   a flexible circuit conductor for transmitting the electrical signal to or from the transducer along controlled impedance transmission lines, one end of which is supported by the stiffening plate and electrically connected to the transducer within the enclosure, the other end of which extends outside of the housing for electrical connection with control electronics of a host device;
   wherein the stiffening plate includes an annular ring extending therefrom with a slot, which extends substantially perpendicularly to the optical axis, through which the flexible circuit conductor extends.

10. The optical subassembly according to claim 9, wherein the annular ring of the stiffening plate includes teeth extending therefrom for interlocking with corresponding teeth extending from the housing.

11. An optical sub-assembly comprising:
an optical connector for receiving an end of an optical fiber, which transmits a beam of light including an optical signal;
a housing coupled to the optical connector;
a stiffening plate mounted on an end of the housing forming an enclosure therewith;
a transducer mounted on the stiffening plate for converting the optical signal into an electrical signal or for converting an electrical signal into the optical signal;
a lens mounted in the housing for relaying the beam of light between the optical fiber and the transducer along an optical axis; and
a flexible circuit conductor for transmitting the electrical signal to or from the transducer along controlled impedance transmission lines, one end of which is supported by the stiffening plate and electrically connected to the transducer within the enclosure, the other end of which extends outside of the housing for electrical connection with control electronics of a host device;
wherein a surface of the stiffening plate is disposed at an angle between 80° and 85° from the optical axis to minimize back reflections of light into the optical fiber.

12. The optical sub-assembly according to claim 11, wherein the transducer is positioned in close enough proximity to the lens to provide a magnification of the optical fiber of less than one to reduce a spot size of the beam of light to between 20 to 40 μm diameter.

13. An optical sub-assembly comprising:
an optical connector for receiving an end of an optical fiber, which transmits a beam of light including an optical signal;
a housing coupled to the optical connector;
a stiffening plate mounted on an end of the housing forming an enclosure therewith;
a transducer mounted on the stiffening plate for converting the optical signal into an electrical signal or for converting an electrical signal into the optical signal;
a lens mounted in the housing for relaying the beam of light between the optical fiber and the transducer along an optical axis; and
a flexible circuit conductor for transmitting the electrical signal to or from the transducer along controlled impedance transmission lines, one end of which is supported by the stiffening plate and electrically connected to the transducer within the enclosure, the other end of which extends outside of the housing for electrical connection with control electronics of a host device;
wherein the end of the flexible circuit conductor attached to the stiffener includes an opening through which the transducer extends, whereby the flexible circuit conductor surrounds the transducer.

14. An optical sub-assembly comprising:
an optical connector for receiving an end of an optical fiber, which transmits a beam of light including an optical signal;
a housing coupled to the optical connector;
a stiffening plate mounted on an end of the housing forming an enclosure therewith comprising a printed circuit board material;
a transducer mounted on the stiffening plate for converting the optical signal into an electrical signal or for converting an electrical signal into the optical signal;
a lens mounted in the housing for relaying the beam of light between the optical fiber and the transducer along an optical axis; and
a flexible circuit conductor for transmitting the electrical signal to or from the transducer along controlled impedance transmission lines, one end of which is supported by the stiffening plate and electrically connected to the transducer via circuits in the printed circuit board material, the other end of which extends outwardly for electrical connection with control electronics of a host device;
wherein the transducer is positioned in close enough proximity to the lens to provide a magnification of the optical fiber of less than one to reduce a spot size of the beam of light to between 20 μm and 40 μm diameter.

15. The optical subassembly according to claim 14, wherein the optical connector, the lens and the housing are integrally formed.

16. The optical subassembly according to claim 14, wherein the transducer comprises a rear illuminated photodetector flip chip bonded onto a transimpedance amplifier, which is mounted on the stiffener plate and electrically connected to the flexible circuit conductor.

17. The optical sub-assembly according to claim 14, wherein the transducer comprises a front illuminated photodetector mounted on a transimpedance amplifier.

* * * * *